(12) United States Patent
Van et al.

(10) Patent No.: US 6,922,067 B1
(45) Date of Patent: Jul. 26, 2005

(54) DETERMINATION OF MINORITY CARRIER DIFFUSION LENGTH IN SOLID STATE MATERIALS

(75) Inventors: Phuc Van, San Jose, CA (US); Alexander Pravdivtsev, Mountain View, CA (US)

(73) Assignee: Ahbee 2, L.P., San Jose, CA (US)

( * ) Notice: Subject to any disclaimer, the term of this patent is extended or adjusted under 35 U.S.C. 154(b) by 8 days.

(21) Appl. No.: 10/717,257

(22) Filed: Nov. 18, 2003

(51) Int. Cl.[7] ............................................. G01R 31/302
(52) U.S. Cl. ...................... 324/752; 324/753; 324/765
(58) Field of Search ......................... 324/715, 750–753, 324/765, 767; 250/306–307, 310–311, 492.21; 356/401

(56) References Cited

U.S. PATENT DOCUMENTS

| | | | |
|---|---|---|---|
| 4,333,051 A | * | 6/1982 | Goodman ................... 324/752 |
| 5,025,145 A | * | 6/1991 | Lagowski ................ 250/214 R |
| 5,663,657 A | * | 9/1997 | Lagowski et al. ........... 324/766 |
| 6,512,384 B1 | * | 1/2003 | Lagowski et al. ........... 324/752 |

* cited by examiner

Primary Examiner—Minh N. Tang

(57) ABSTRACT

An apparatus and method is provided for determining the minority carrier diffusion length from the back side of the wafer within predetermined areas using pattern recognition system. In particular embodiments SPV probe includes transparent and non-transparent electrodes, to provide measurement of SPV and in area larger than optical beam and to provide accurate determination of diffusion length with spatial resolution <1 mm. The apparatus includes the ability to measure diffusion length from the areas under special areas within scribe line of patterned wafer. This apparatus and method provides a determination of the diffusion length to control metal contamination in product including patterned wafers including measurement within scribe lines and full wafer mapping.

17 Claims, 9 Drawing Sheets

DETERMINATION OF MINORITY CARRIER DIFFUSION LENGTH IN SOLID STATE MATERIALS

FIELD OF INVENTION

This invention relates to determining the diffusion length in solid state materials.

BACKGROUND OF THE INVENTION

The purity of the silicon wafers depends upon the concentration of different impurities, including heavy metal contaminates (e.g., Fe, Cr, Cu), introduced during the manufacturing and processing of semiconductor devices. The minority carrier lifetime and the diffusion length are used for contamination monitoring in silicon wafers. The challenge is to measure diffusion length, and monitor contamination in the product wafers, at all steps in the processing and manufacturing of integrated circuits.

In current techniques, the intensity-modulated light, with the photon energy larger than the band gap, is directed to the front side of semiconductor. As a result of photo generation, the excess carriers change the surface potential of the semiconductor, and alternative surface photo voltage (SPV) is measured using a transparent conducting electrode placed near the front surface of the silicon wafer, within the illumination area. Diffusion length is determined by measurements of the SPV signals and light fluxes under successive illuminations of the wafer with monochromatic light at different wavelengths.

The American Society for Testing and Materials (ASTM) recommends two methods, F 391 A and B, for SPV measurement of the diffusion length. The calculation of the diffusion length is based upon the solution of the one-dimensional diffusion equation for excess minority carriers, assuming that diffusion length is short compared to ¼ wafer thickness.

This expression is $$\Delta n = \Phi \frac{1-R}{D/L + S_F} \cdot \frac{\alpha L}{\alpha L + 1} \quad (1)$$

where $\Delta n$ is the excess minority carrier concentration, L is the diffusion length, $\alpha$ is the absorption coefficient, $\Phi$ is the incident light flux, R is the reflectivity of the semiconductor, D is the minority carrier diffusion constant, and $S_F$ is the front side surface recombination velocity. This method has been described in the patent to A. M. Goodman in U.S. Pat. No 4,333,051, 1982. The SPV has monotonical dependence versus light flux with linear region for small level excitation. This method has been described in the patent to A. M. Goodman in U.S. Pat. No 4,333,051, 1982.

In the first ASTM-recommended method F391 A, the magnitude of SPV is adjusted to the same value by changing the light intensity at each wavelength. The effective diffusion length is obtained from the linear plot of the light flux, $\Phi$, versus the light penetration depth $\alpha^{-1}$. The effective diffusion length equals the intercept value $L_{EFF} = -\alpha^{-1}$ at $\Phi=0$. The effective diffusion length depends on the bulk lifetime, $\tau$, and the surface recombination velocity, Sb, at the back surface of the wafer. If the effective diffusion length is less then one-fourth wafer thickness, $L_{EFF}$ can be taken to be equal to the diffusion length $L=\sqrt{D\tau}$, where $\tau$ is the minority carrier lifetime.

The second ASTM recommended method F-391-B is the linear constant photon flux method, which uses the SPV measurement for several different wavelengths of light with the same intensity, where the photovoltage has linear dependence versus light intensity. The diffusion length is obtained using the linear plot of the inverse value of the surface photovoltage as a function of light penetration depth. This method is discussed in the patents to Lagowski U.S. Pat. Nos. 5,025,145 and 5,177,351 and J. Lagowski, et. al., *Semicond, Sci, Technol.* 7, A185 (1992). The apparatus includes halogen light sources with a wavelength selecting wheel for illumination and a quartz disk with indium thin oxide (ITO) film for directing the light onto the wafer surface and detecting an SPV signal.

In the patent to Lagowski et al., U.S. Pat. No. 5,663,657, another SPV probe is used. The SPV electrode consists of a quartz disk with an evaporated transparent conductance indium thin oxide (ITO) film with the diameter smaller than the diameter of the disk and hence the illumination area. The SPV probe configuration allows one to diminish the systematic error of the diffusion length measurement by excluding the influence of the lateral diffusion of the minority carriers in the bulk of the wafer.

In a Russian patent No 2080689 (1994), the apparatus includes a transparent and conductive electrode, a set of light emission diodes and an objective lens to focus the light through said transparent electrode onto a spot of the wafer. The diameter of the electrode is larger than the optical beam diameter. This configuration is different with respect to U.S. Pat. No. 5,663,657, where the illumination area is larger than the electrode and at the same time also eliminates error due to lateral diffusion of the minority carriers in the body of the wafer and provides better spatial resolution for the diffusion length measurement. In *Proceedings of 24th ESSDERC'94*, Edinburgh, p.601 (1994), using numerical calculations and the experiment, it was shown that this apparatus can be used for fast mapping (2 minutes with 8000 points) of the diffusion length, with improved spatial resolution close to the optical beam diameter, $d_B$, even if L is comparable with $d_B$.

SUMMARY OF THE INVENTION

An advantage of the present invention is to provide non-contact apparatus and method for measurements of the diffusion length, especially for patterned product silicon wafers.

Another advantage of the present invention is to provide a non-contact apparatus and method for diffusion length measurement in the region of scribe lines of patterned silicon wafers.

In one embodiment, the invention features an apparatus for measuring the diffusion length with high spatial resolution around 0.1–1 mm from the backside of the product wafer in its predetermined regions. This apparatus includes a probe for measuring surface photovoltage from the backside of the semiconductor wafer. The probe includes an optical element, placed in proximity with semiconductor surface, for directing uniform light flux onto the area of the semiconductor wafer. The probe further includes a detection element, which consists of a transparent and conducting first electrode with a diameter 0.1–1 mm, coated on the surface of the said optical element close to the wafer and a conducting non transparent second electrode, connected to the first electrode and overlapping it. The apparatus also include a set of laser diodes with different wavelengths installed in optical combiners, a series of optical fibers connected to the SPV probe, an optical collimator for directing light on said optical element and a photo detector. The apparatus also includes an optical system with a CCD camera installed from the front surface of the wafer coaxially with said optical element of SPV probe. This system is designed for pattern recognition and measurement of the diffusion length in the bulk of the wafer in predetermined regions, including the regions under the testing areas located within scribe lines. Embodiments include the wafer chuck with the diameter smaller than the diameter of the wafer to get access to front and backside of the wafer.

In another embodiment of the invention, the apparatus additionally includes the second SPV probe for diffusion length measurement with low spatial resolution >1 mm. This SPV probe can be used to obtain a full wafer map of the diffusion length. The second SPV probe may include a transparent disk with a diameter >1 mm as an optical element for directing light flux onto semiconductor wafer. The transparent disk has a transparent conducting material (first electrode) covering the surface of the transparent disk. The transparent disk is placed inside of a metal ring (second electrode), which has electrical contact with the transparent and conducting material. The electrodes are connected to the preamplifier and lock-in amplifier. The apparatus also includes a set of LED's with interference filters, a series of optical fibers bundles connected to the SPV probe and directing light on said optical element—transparent disk, and photo detector.

In the third embodiment of the invention, the apparatus can include multiple SPV probes for diffusion length measurement. These multiple SPV probes can be used simultaneously at different locations on the sample, to cut the measurement time significantly, compared with a single SPV probe running in a sequential measurement mode. For example, the apparatus can include 2 SPV probes with low spatial resolution >1 mm and 1 SPV probe with high spatial resolution 0.1–1 mm. One low resolution SPV probe can be used with one LED at certain wavelengths, while the other low resolution SPV probe can be used with the same or another LED at the same or different wavelength. In this way, the measurement time of multiple sites per sample can be cut in half. After measuring by multiple resolution SPV probes, one or several specific locations (scribe lines etc.) may be measured by high resolution SPV probe.

In the fourth embodiment, the invention features a method for fast mapping of the diffusion length. This method includes one or several pulses of light at one wavelength alternating with one or several pulses of light at another wavelength. In this way the measurement time can be cut in half.

Other advantages include but are not limited to the following:

1) The SPV probe, including transparent and non-transparent electrodes, improves spatial resolution and accuracy of the diffusion length measurement by making uniform light intensity distribution inside the transparent electrode; 2) The SPV probe with reduced size of transparent electrode <1 mm provide measurements within scribe lines; 3) The apparatus and method improves accuracy of measurement of very long diffusion length, 4) The apparatus and method improves accuracy of fast measurement of the diffusion length for its fast mapping; and 5) Multiple probes usage improves the apparatus throughput for wafer mapping.

DETAILED DESCRIPTION OF THE PREFERED EMBODIMENTS

Figure 1:
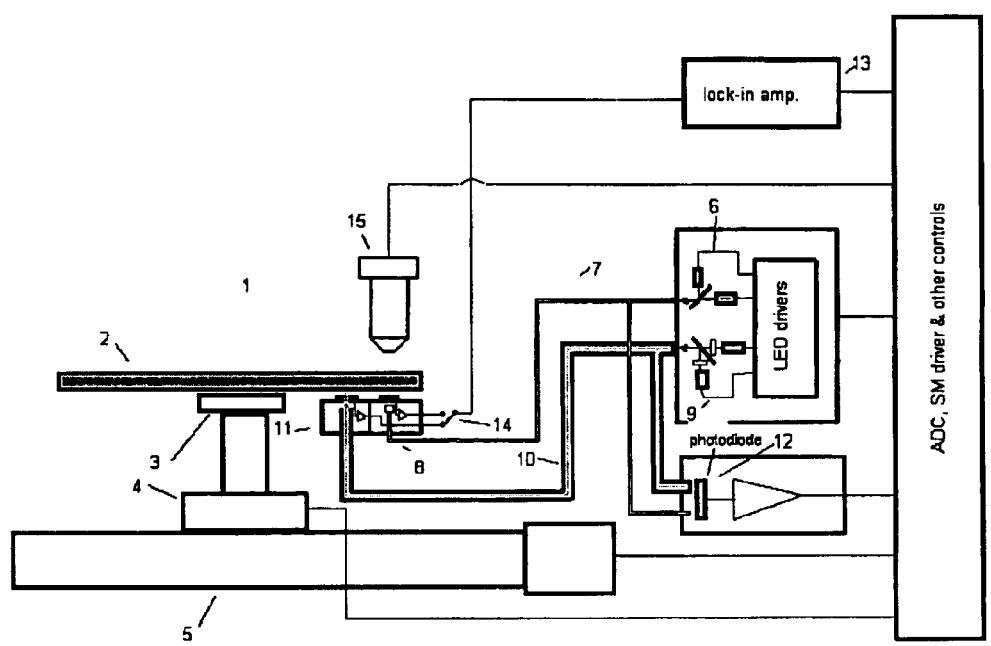
FIG. 1 is a schematic diagram of an apparatus adapted for determining a minority carrier diffusion length in predetermined areas in accordance with the invention.

Probe and Apparatus:

Referring to FIGS. 1, 1A, 1B, 2, 3, 4, an apparatus 1 is shown for determining minority carrier diffusion length of a semiconductor wafer 2. Briefly, the apparatus includes a grounded chuck 3 with diameter less than the diameter of the silicon wafer 2. The wafer chuck 3 is mounted on the rotary stage 4 and linear stage 5. For measurement in the central region the position of the wafer on the chuck is changed using robotic or other system. The apparatus also includes optical and electrical components, which give possibility to illuminate the back surface of the wafer and detect the surface photo voltage on the back surface. A first source of the light 6 consists of two or more laser LED's installed in the optical combiners. A first source of the photons 6 is coupled through first optical fiber system 7 to first SPV transducer 8 to direct light onto back surface of the wafer. A second source of the photons 9 consists of two or more LED's with interference optical filters. A second source of the photons 9 is coupled through fiber bundle system 10 to a second back SPV transducer 11 to direct light onto back surface of the wafer. Both sources of photons are coupled to a photo detector 12. The photo detector 12 is connected to the preamplifier and than to the computer. Probes are coupled to the lock-in amplifier 13 by a computer-controlled switch 14, so that photo voltage from both probes can be analyzed. The output of lock-in amplifier 13 is connected to the interface. Referring to FIG. 1, the apparatus includes an optical microscope with CCD camera 15 for pattern recognition, installed coaxially with the electrode of the first SPV probe 8.

Figure 1A:
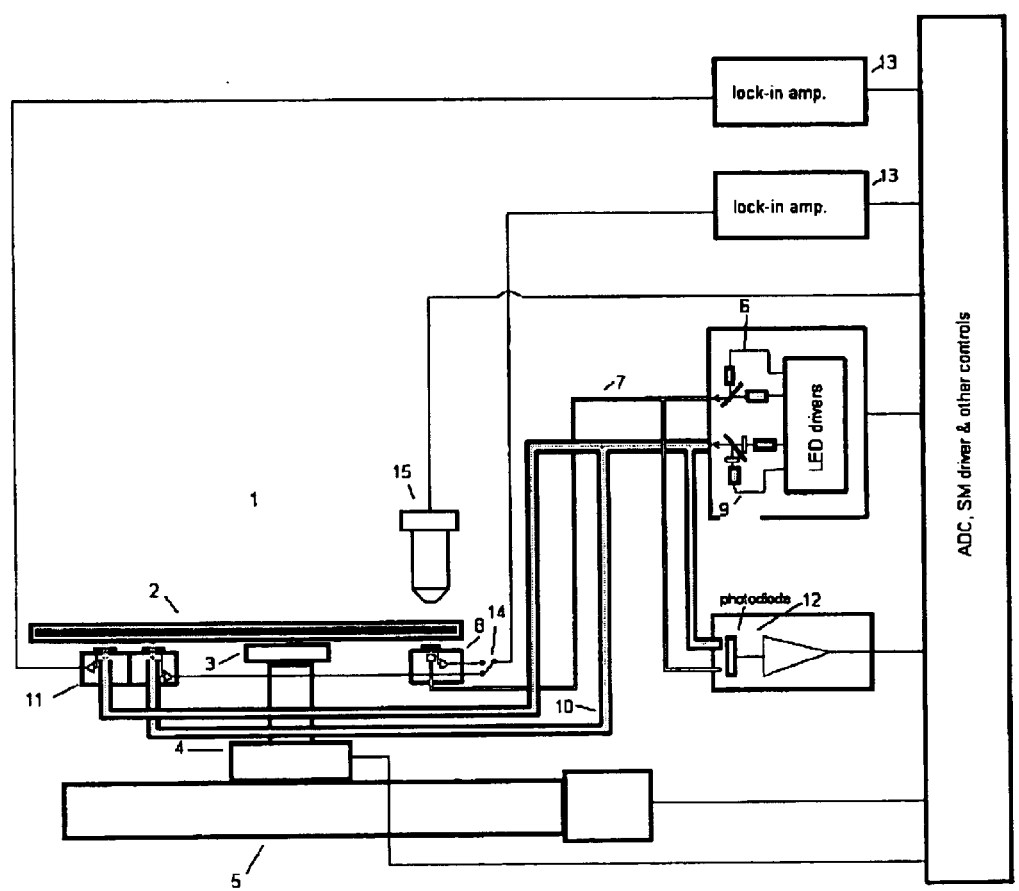
FIG. 1A is an example of a schematic diagram of an apparatus adapted for determining a minority carrier diffusion length in predetermined areas in accordance with the invention in which a second low resolution probe is installed and both low resolution probes share the same set of light sources and both low resolution probes share the same light flux detector.
Figure 1B:
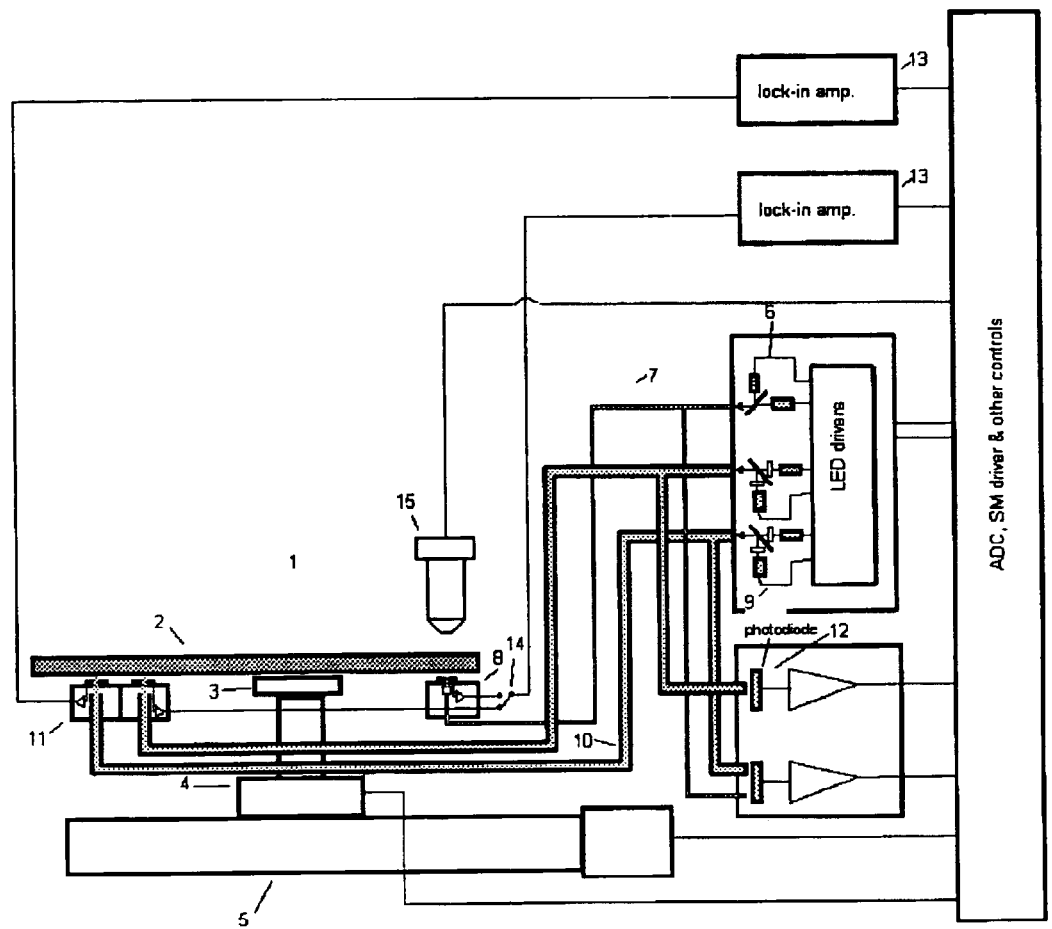
FIG. 1B is an example of a schematic diagram of an apparatus adapted for determining a minority carrier diffusion length in predetermined areas in accordance with the invention in which a second low resolution probe is installed and each low resolution probe has a separate set of light sources and each low resolution probe has a separate light flux detector.

These examples of the arrangement of the apparatus including multiple SPV probes are shown at FIG. 1A and FIG. 1B. At the arrangement of the apparatus shown at FIG. 2A, 2 SPV probes with low spatial resolution >1 mm use the same set of light sources. At the arrangement of the apparatus shown at FIG. 1B, both probes with low spatial resolution >1 mm use separate sets of light sources.

Figure 2:
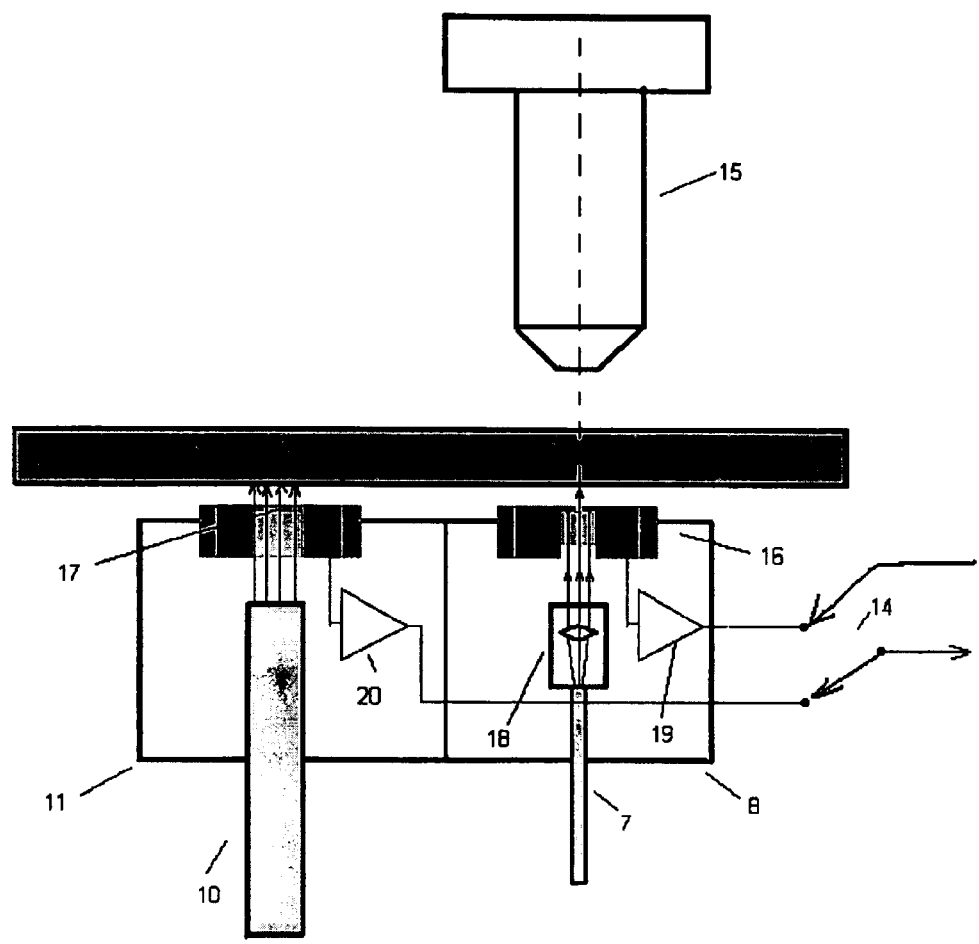
FIG. 2 is a schematic diagram of SPV probes and optical microscope arrangement in accordance with the invention.
Figure 3:
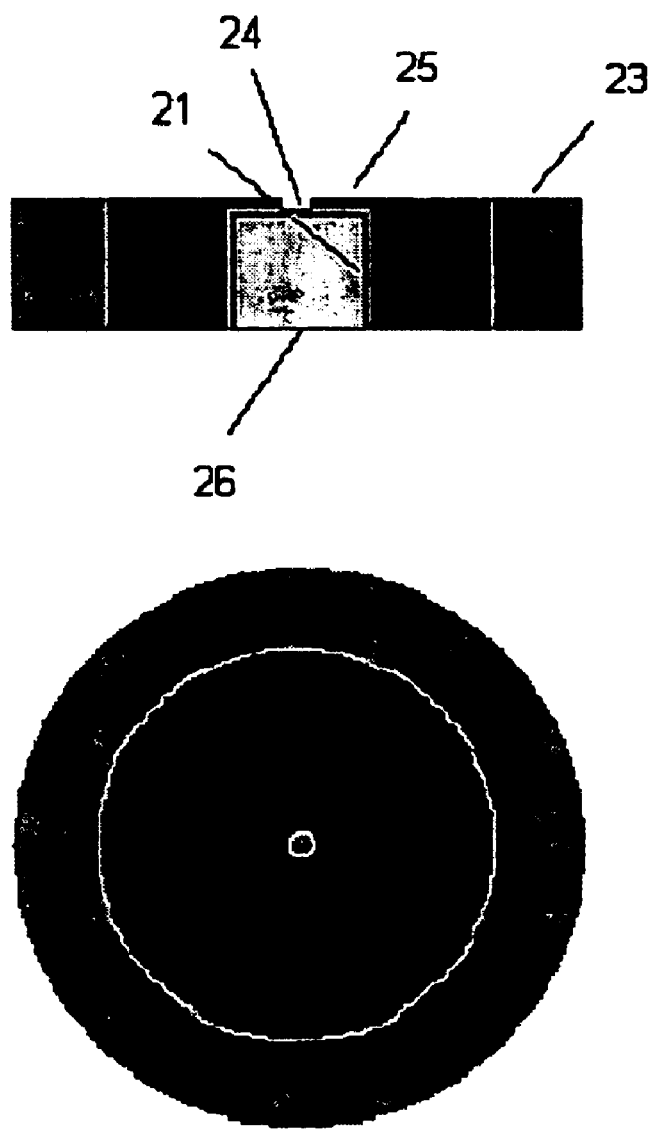
FIG. 3 is an arrangement of the pick-up electrode.
Figure 4:
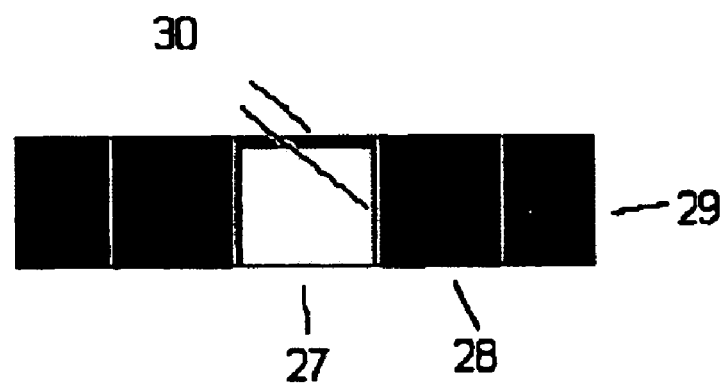
FIG. 4 is an arrangement of the pick-up electrode.
Figure 4:
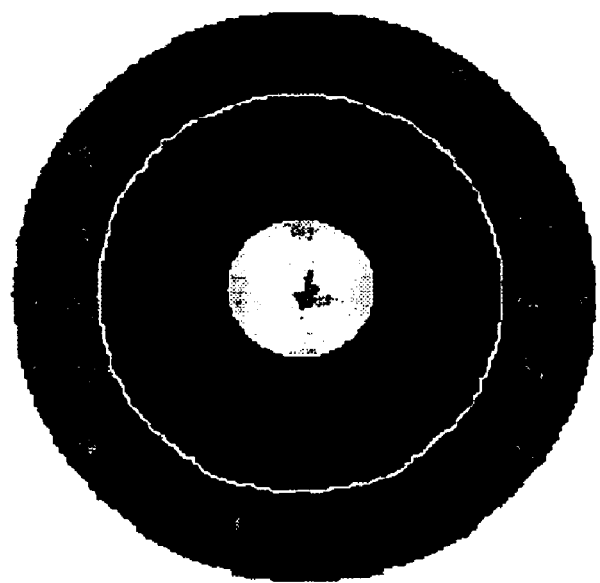
Figure 5:
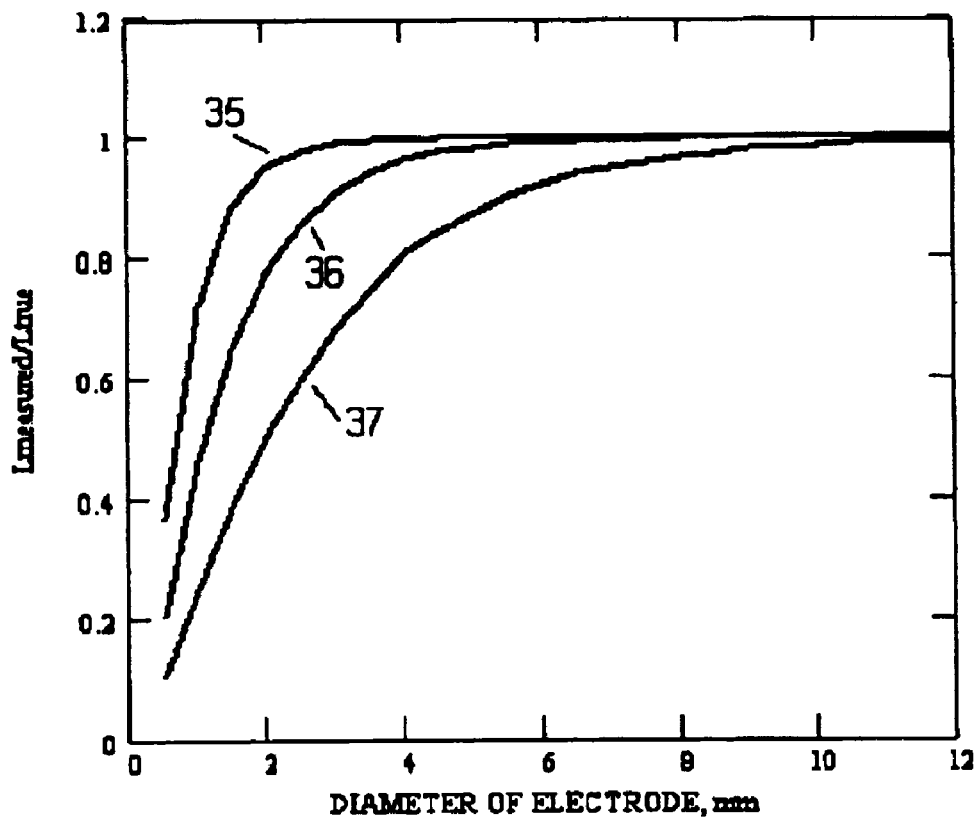
FIG. 5 is a calculated plot of dependence error of the diffusion length measurement versus electrode diameter for optical beam 0.5 mm for L=375 $\mu$m, 750 $\mu$m, 1500 $\mu$m.

In more detail, the arrangement of the SPV probes and optical microscope is shown at FIG. 2. The first SPV probe 8 includes electrode 16, optical collimator 18 at the end of the optical fiber 7 and preamplifier 19 connected to the electrode 16. The second SPV probe 11 includes electrode 17, optical fiber bundle 10 and preamplifier 20 connected to the electrode 17. Referring to FIG. 3 and FIG. 4 for accurate measurement of the diffusion length, the special electrodes configurations are used. The electrode 16 consists of glass or quartz disk 26 with ITO coating 21 installed inside metal ring 25 with diaphragm 24 and dielectric ring 23. The electrode 17 consists of glass or quartz disk 27 with ITO coating 30 installed inside metal ring 28 and dielectric ring 29. The dimensions of these electrodes should be chosen according to theoretical calculations. Referring to FIG. 5, the curves 35, 36, 37 are the calculated curves of a ratio of measured diffusion length to true L value for light beam diameter 0.5 mm versus diameter of electrode for Ltrue=375 μm; 750 μm; 1000 μm.

For measurement of the diffusion length up to 1 mm with spatial resolution 0.1–1 mm, the diameter of the transparent disk 16 should be 0.1–1 mm and the outer diameter of the metal ring should be larger than 8 mm. This electrode configuration gives optimal signal noise ratio and lateral resolution for measurement within scribe line. This configuration is implemented in electrode 16.

For measurement of the diffusion length up to 1 mm with spatial resolution 5 mm, the diameter of the transparent disk 16 should be 5 mm and the outer diameter of the metal ring should be larger than 8 mm. This electrode configuration gives optimal signal noise ratio and lateral resolution for full wafer mapping of the diffusion length measurement within the scribe line. This configuration is implemented in electrode 17.

Figure 6:
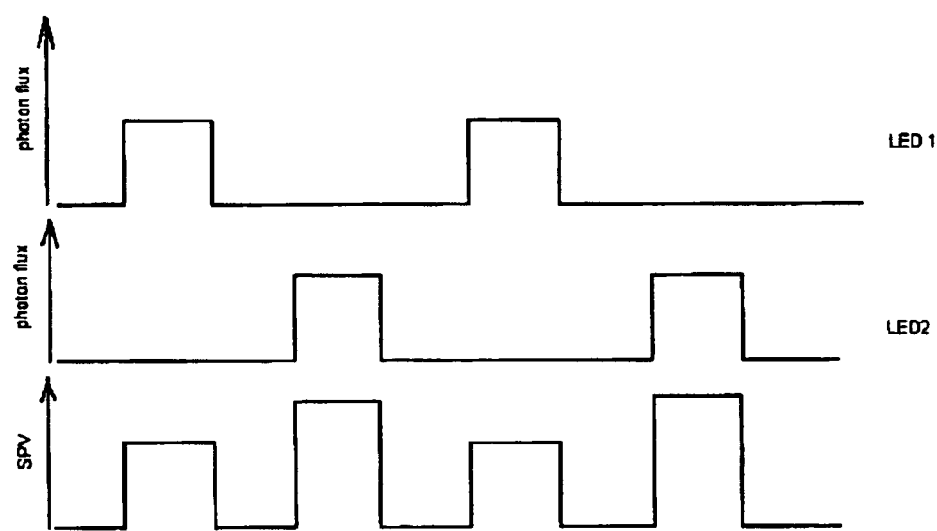
FIG. 6 is a diagram of the light intensity and SPV signal vs. time for fast diffusion length mapping if one pulses of the first light source alternates with one light pulse of the second light source.
Figure 6A:
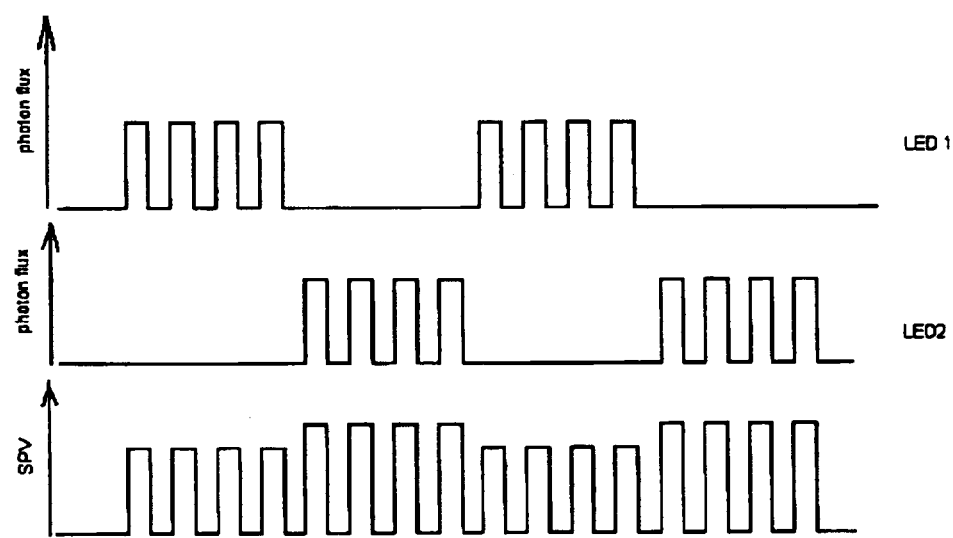
FIG. 6A is a diagram of the light intensity and SPV signal vs. time for fast diffusion length mapping if four pulses of the first light source alternates with four light pulse of the second light source.

For fast diffusion length mapping with both high and low spatial, the wafer surface can be illuminated by 1 or several pulses of light at one wavelength (FIG. 6 and FIG. 6A), alternating with one or several pulses of light at different wavelengths. An example when the wafer surface is illuminated by 4 pulses of light at one wavelength alternating with 4 pulses of light at different wavelengths is shown at FIG. 5A.

Diffusion Length Determination.

The procedure of measurement includes the following steps:

a) positioning the wafer 2 using pattern recognition system 8 to get the predetermined region of the wafer front surface over the illumination area on back side wafer surface;

b) illumination of the back surface of the wafer 2 with monochromatic light at series of wavelength $\lambda_i$ and modulating frequency f using light source 6, optical fiber 7 and SPV probe 8 and measurement of SPV signal, $V_i$, using SPV probe 8 and lock-in amplifier 13 and measurement of light flux $\Phi_1$ using a photodiode 12;

c) illuminating said area at different intensities at the same wavelength $\lambda_1$, measuring light fluxes $\Phi_1$ and $\Phi_{11}$ and corresponding surface photovoltages $V_1$;

d) recalculating SPV signals using the formulas:

$$C_{NL} = \frac{V_{11} \cdot \Phi_1^2 - V_1 \cdot \Phi_{11} \cdot \Phi_1}{V_{11} \cdot \Phi_1^2 - V_1 \cdot \Phi_{11}^2}$$

$$V_i^L = \frac{1 - C_{NL}}{1 - C_{NL} \cdot V_i/V_1} V_i$$

e) determining diffusion length using values $Vi^1$, $\Phi_i$ and intercept of the plot $\Phi_i/Vi^1$ versus light penetration depths.

The light wavelengths can be in the range 800–1000 nm and light modulating frequency is in the range 400–5000 Hz To get full wafer map of the diffusion length the second SPV 11 probe can be used.

The procedure of measurement includes the following steps:

a) illumination of the back surface of the wafer 2 with monochromatic light at series of wavelength $\lambda_i$ and modulating frequency f using light source 9, optical fiber 10 and SPV probe 11 and measurement of SPV signal, $V_i$, using SPV probe 11 and lock-in amplifier 13 and measurement of light flux $\Phi_1$ using photodiode 12;

b) illuminating said area at different intensities at the same wavelength $\lambda_1$, measuring light fluxes $\Phi_1$ and $\Phi_{11}$ and corresponding surface photovoltages $V_1$;

e) recalculating SPV signals using the formulas:

$$C_{NL} = \frac{V_{11} \cdot \Phi_1^2 - V_1 \cdot \Phi_{11} \cdot \Phi_1}{V_{11} \cdot \Phi_1^2 - V_1 \cdot \Phi_{11}^2}$$

$$V_i^L = \frac{1 - C_{NL}}{1 - C_{NL} \cdot V_i/V_1} V_i$$

e) determining diffusion length using values $Vi^1$, $\Phi_i$ and intercept of the plot $\Phi_i/Vi^1$ versus light penetration depths.

Using the measurement of the diffusion length within scribe lines and full wafer map of the diffusion length more detail information concerning metal contamination during technological processing can be obtained.

What is claimed is:

1. An apparatus for determining the diffusion length of semiconductor wafers comprising:

a probe for directing radiation on an area of back side wafer surface to excite charge carriers, create and detect a surface photovoltage, said probe including an electrode, including a transparent element placed on surface of the electrode in the path of said radiation and a non transparent element surrounding said transparent element, said electrode is placed in proximity to the back side of the wafer, means for illuminating of the surface at different wavelengths, including two or more different sources of monochromatic light driven by light drivers controlled by a computer, means for directing light flux onto said electrode of the probe and a photo detector, means for measuring surface photovoltage (SPV) signals picked up by said electrode, said means for measuring including SPV pre-amplifier and lock-in amplifier with said electrode connected to the input of said SPV pre-amplifier, the output of said SPV pre-amplifier connected to the output of said lock-in amplifier and the output of said lock-in amplifier connected to said computer, means for measuring light flux including pre-amplifier with said photo detector connected to the input of said pre-amplifier and the output of said pre-amplifier connected to said computer, an optical system installed from the front surface of the wafer coaxially with said electrode, said optical system being designed for pattern recognition, said optical system including objective lens and CCD matrix with said CCD matrix output connected to said computer, means for positioning said optical system coaxially with said electrode, and means for wafer positioning using for measurements in different locations including one or more linear stages and a rotary stage, said linear stages and said rotary stage controlled by said computer.

2. The apparatus as in claim 1, wherein the transparent element is a transparent glass or quartz disk, said transparent disk has a transparent and conducting coating on its top and side surfaces, said transparent disk being installed inside a metal ring with a diaphragm covering a part of said transparent disk excluding a central region.

3. The apparatus as in claim 2, wherein the diameter of said central region is in the range 0.1–1 mm and outer diameter of the metal ring is 8–10 mm.

4. The apparatus as in any one of claims 1–3, wherein means for illuminating wafer surface includes laser diodes installed in an optical combiners, said optical combiners coupled with optical fibers.

5. The apparatus as in any one of claims 1–4, wherein the means for directing light flux onto said electrode of the probe includes a Y-shaped optical fiber, with one end of the optical fiber is connected to an optical collimator installed in proximity with said optical transparent element, and the other end of the optical fiber splits light flux between said transparent element and the photo detector.

6. The apparatus as in any one of claims 1–5, wherein said apparatus further comprises:

a second probe for directing a second radiation on an area on the back side wafer surface to excite charge carriers, create and detect a surface photovoltage from back side of the wafer, said second probe including a second electrode including a second transparent element and a second non-transparent element, where said second transparent element is placed on the path of said second radiation and said second non-transparent element surrounding said second transparent element, said second electrode of the second probe and a second photo detector is placed in proximity to the back side of the wafer, a second means for illumination of the back side of the wafer surface at different wavelengths, including different sources of monochromatic light driven by light drivers controlled by said computer, a second means for directing light flux onto said second transparent element of said second electrode of the second probe and a second photo detector, a second means for measuring surface photovoltage signals picked up by said second electrode including a second pre-amplifier and a second lock-in amplifier with said second electrode connected to the input of said second pre-amplifier, the output of said second pre-amplifier connected to the input said second lock-in amplifier and the output of said second lock-amplifier connected to said computer, and second means for measuring light flux including pre-amplifier with said photo detector connected to pre-amplifier input and said pre-amplifier output connected to computer.

7. The apparatus as in claim 6, wherein the second transparent element of the second probe is a second transparent glass or quartz disk, said second transparent disk having a transparent and conducting coating on its top and side surfaces, said transparent disk installed inside a second metal ring.

8. The apparatus as in claim 7, wherein the diameter of said second transparent disk is in the range 1–7 mm and outer diameter of the second metal ring is 8–14 mm.

9. The apparatus as in any one of claims 6–8, wherein said second means for illuminating the wafer surface includes light emitting diodes with interference optical filters, said LED's coupled with optical fiber bundles.

10. The apparatus as in any one of claims 6–9, wherein the second means for directing light flux onto said second transparent element of the second probe includes Y-shaped optical fiber bundles, where one of the end of these optical fiber bundles is coupled with said second probe and the other end of the optical fiber bundles splits light flux between said second transparent element of said second probe electrode and said second photo detector.

11. The apparatus as in any one in claims 6–10 wherein said apparatus includes two or more SPV units for said apparatus throughput improvement.

12. A method for determining diffusion length in predetermined regions of the wafer, comprising:

positioning a wafer, using a pattern recognition system to get the predetermined region of the wafer over an illumination area on a back side wafer surface, illuminating said area on the back side wafer surface with frequency modulated light with predetermined intensities at a series of wavelengths, $\lambda_i$, measuring light fluxes $\Phi_i$ directed onto said illumination area and measuring photovoltages $V_i$ from said illuminating area, illuminating said area at different intensities at the same wavelength $\lambda_1$, measuring light fluxes $\Phi_1$ and $\Phi_{11}$ and corresponding surface photovoltages $V_1$, recalculating SPV signals using the formulas:

$$C_{NL} = \frac{V_{11} \cdot \Phi_1^2 - V_1 \cdot \Phi_{11} \cdot \Phi_1}{V_{11} \cdot \Phi_1^2 - V_1 \cdot \Phi_{11}^2}$$

$$V_i^L = \frac{1 - C_{NL}}{1 - C_{NL} \cdot V_i/V_1} V_i, \text{ and}$$

determining diffusion length using values $Vi^1$, $\Phi_i$ and intercept of the plot $\Phi_i/Vi^1$ versus light penetration depth.

13. The method as in claim 12 wherein the wafer is positioned using pattern recognition system to get the predetermined region of the wafer within scribe line over the illumination area on the back side wafer surface.

14. The method as in claim 12, wherein the light wavelengths are in the range 800–1000 nm.

15. The method as in claim 12, wherein the light modulating frequency is in the range 400–5000Hz.

16. The method as in claim 12, wherein multiple SPV probes are used simultaneously.

17. The method as in claim 12, wherein one or several pulses of light at one wavelength alternate with one or several pulses of light at different wavelength.

* * * * *